(12) United States Patent
Reimers

(10) Patent No.: US 11,704,025 B2
(45) Date of Patent: *Jul. 18, 2023

(54) SOLID STATE STORAGE DEVICE WITH VARIABLE LOGICAL CAPACITY BASED ON MEMORY LIFECYCLE

(71) Applicant: Micron Technology, Inc., Boise, ID (US)

(72) Inventor: Niels Reimers, Meadow Vista, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/859,962

(22) Filed: Jul. 7, 2022

(65) Prior Publication Data

US 2022/0342560 A1 Oct. 27, 2022

Related U.S. Application Data

(62) Division of application No. 14/874,841, filed on Oct. 5, 2015, now Pat. No. 11,385,797.

(51) Int. Cl.
*G06F 12/00* (2006.01)
*G06F 3/06* (2006.01)
(Continued)

(52) U.S. Cl.
CPC .......... *G06F 3/0616* (2013.01); *G06F 3/0644* (2013.01); *G06F 3/0653* (2013.01);
(Continued)

(58) Field of Classification Search
CPC .... G06F 3/0616; G06F 3/0644; G06F 3/0653; G06F 3/0679; G06F 12/0246; G06F 12/0615
See application file for complete search history.

(56) References Cited

U.S. PATENT DOCUMENTS

| 7,734,888 B1 | 6/2010 | Hamilton et al. |
| 2007/0061498 A1 | 3/2007 | Chua et al. |

(Continued)

FOREIGN PATENT DOCUMENTS

| CN | 103309815 A | 9/2013 |
| EP | 2657846 A1 | 10/2013 |
| WO | 2015034954 A1 | 3/2015 |

OTHER PUBLICATIONS

EP Patent Application No. 16854043.3—Extended European Search Report, dated Apr. 25, 2019, 10 pages.
(Continued)

*Primary Examiner* — Gurtej Bansal
(74) *Attorney, Agent, or Firm* — Perkins Coie LLP

(57) ABSTRACT

Several embodiments of memory devices and systems having a variable logical memory capacity are disclosed herein. In one embodiment, a memory device can include a plurality of memory regions that collectively define a physical memory capacity and a controller operably coupled to the plurality of memory regions. The controller is configured to advertise a first logical memory capacity to a host device, determine that at least one of the memory regions is at or near end of life, and in response to the determination—send a notification to the host device that a logical memory capacity of the memory device will be reduced and then retire the at least one of the memory regions.

20 Claims, 5 Drawing Sheets

(51) Int. Cl.
*G11C 29/00* (2006.01)
*G11C 16/34* (2006.01)
*G06F 12/06* (2006.01)
*G06F 12/02* (2006.01)
*G11C 29/04* (2006.01)

(52) U.S. Cl.
CPC ........ *G06F 3/0679* (2013.01); *G06F 12/0246* (2013.01); *G06F 12/0615* (2013.01); *G11C 16/349* (2013.01); *G11C 29/883* (2013.01); *G06F 2212/7204* (2013.01); *G11C 2029/0409* (2013.01); *G11C 2029/0411* (2013.01)

(56) References Cited

U.S. PATENT DOCUMENTS

| | | | |
|---|---|---|---|
| 2008/0082725 | A1 | 4/2008 | Elhamias |
| 2010/0023800 | A1 | 1/2010 | Harari et al. |
| 2010/0122148 | A1 | 5/2010 | Flynn et al. |
| 2010/0262764 | A1 | 10/2010 | Liu et al. |
| 2010/0293439 | A1* | 11/2010 | Flynn ................. G06F 11/1092 714/763 |
| 2011/0099320 | A1 | 4/2011 | Lucas et al. |
| 2011/0264843 | A1 | 10/2011 | Haines et al. |
| 2013/0346812 | A1 | 12/2013 | Bahirat et al. |
| 2014/0215129 | A1 | 7/2014 | Kuzmin et al. |
| 2015/0131379 | A1 | 5/2015 | Oh |
| 2016/0092121 | A1 | 3/2016 | Nazari et al. |
| 2016/0117104 | A1* | 4/2016 | Hashimoto .......... G11C 29/883 711/171 |
| 2016/0117252 | A1 | 4/2016 | Thangaraj et al. |
| 2017/0097781 | A1 | 4/2017 | Reimers |

OTHER PUBLICATIONS

Office Action dated Dec. 18, 2019 for European Patent Application No. 16854043.3; 9 pages.
Office Action dated Sep. 16, 2020 for Chinese Patent Application No. 201680058935.2; 25 pages (with translation).
Summons to Attend Oral Proceedings dated Feb. 26, 2021 for European Patent Application No. 16854043.3; 10 pages.
TW Patent Application No. 105125526—Taiwanese Office Action and Search Report, dated Jun. 13, 2017, with English Translation, 11 pages.
TW Patent Application No. 105125526—Taiwanese Office Action and Search Report, dated Oct. 23, 2017, with English Translation, 13 pages.
"International Search Report and Written Opinion dated Dec. 16, 2016 in International Application No. PCT/US2016/049911, 14 pages."

* cited by examiner

SOLID STATE STORAGE DEVICE WITH VARIABLE LOGICAL CAPACITY BASED ON MEMORY LIFECYCLE

CROSS-REFERENCE TO RELATED APPLICATION

This application is a divisional of U.S. application Ser. No. 14/874,841, filed Oct. 5, 2015, now U.S. Pat. No. 11,385,797; which is incorporated herein by reference in its entirety.

TECHNICAL FIELD

The disclosed embodiments relate to memory devices and systems, and, in particular, to solid state storage devices (SSDs) having a variable logical memory capacity based on memory lifecycle.

BACKGROUND

SSDs use non-volatile, solid-state storage media to persistently store large amounts of data. SSDs can operate in a manner similar to conventional hard disk drives (HDDs), but lack the motor, magnetic disc, read head, and other moving components of HDDs. SSDs are often constructed from non-volatile media including "NOR flash" media, which has a random access interface, and/or "NAND flash" media, which has a more complicated serial interface than NOR flash. NAND flash is typically favored for bulk data storage because it has a higher memory capacity, lower cost, and faster write speed than NOR flash.

One drawback of non-volatile memory is that it has a limited operational lifetime. This is because write cycles degrade the memory cells in such devices. In particular, the memory cells in NAND flash are programmed by transferring electrons through a thin dielectric layer of a floating gate structure. Over multiple write cycles, the electron transfer through the dielectric layer slowly degrades the dielectric and, thus, the ability of the memory cells to hold the electron charge. This leads to an increasing amount of bit errors when the memory controller reads out the memory cells.

In certain cases, the controller can use error code correction techniques to correct bit errors when they occur relatively frequently. Eventually, however, regions of the memory will degrade to a point where error code correction becomes impractical or impossible. When this happens, the memory controller will no longer write to the effected regions. The memory controller will continue to write to those regions that have not fully degraded, but over time there will be fewer and fewer locations to which it can reliably write. When this occurs, the SSD has reached its end of life. In some instances, an SSD operated at a standard duty cycle may have a lifetime in the range of five to ten years.

DETAILED DESCRIPTION

As described in greater detail below, the present technology relates to memory devices and related systems having a variable logical memory capacity based on memory lifecycle. A person skilled in the relevant art, however, will understand that the technology may have additional embodiments, and that the technology may be practiced without several of the details of the embodiments described below with reference to FIGS. 1-4. In the illustrated embodiments below, the memory devices are described in the context of solid state drives (SSD) having a NAND-based main memory component. Memory devices configured in accordance with other embodiments of the present technology, however, can include other types of memory devices and/or can include main memories that are not NAND based (e.g., NOR based) or only partially NAND based.

Figure 1:
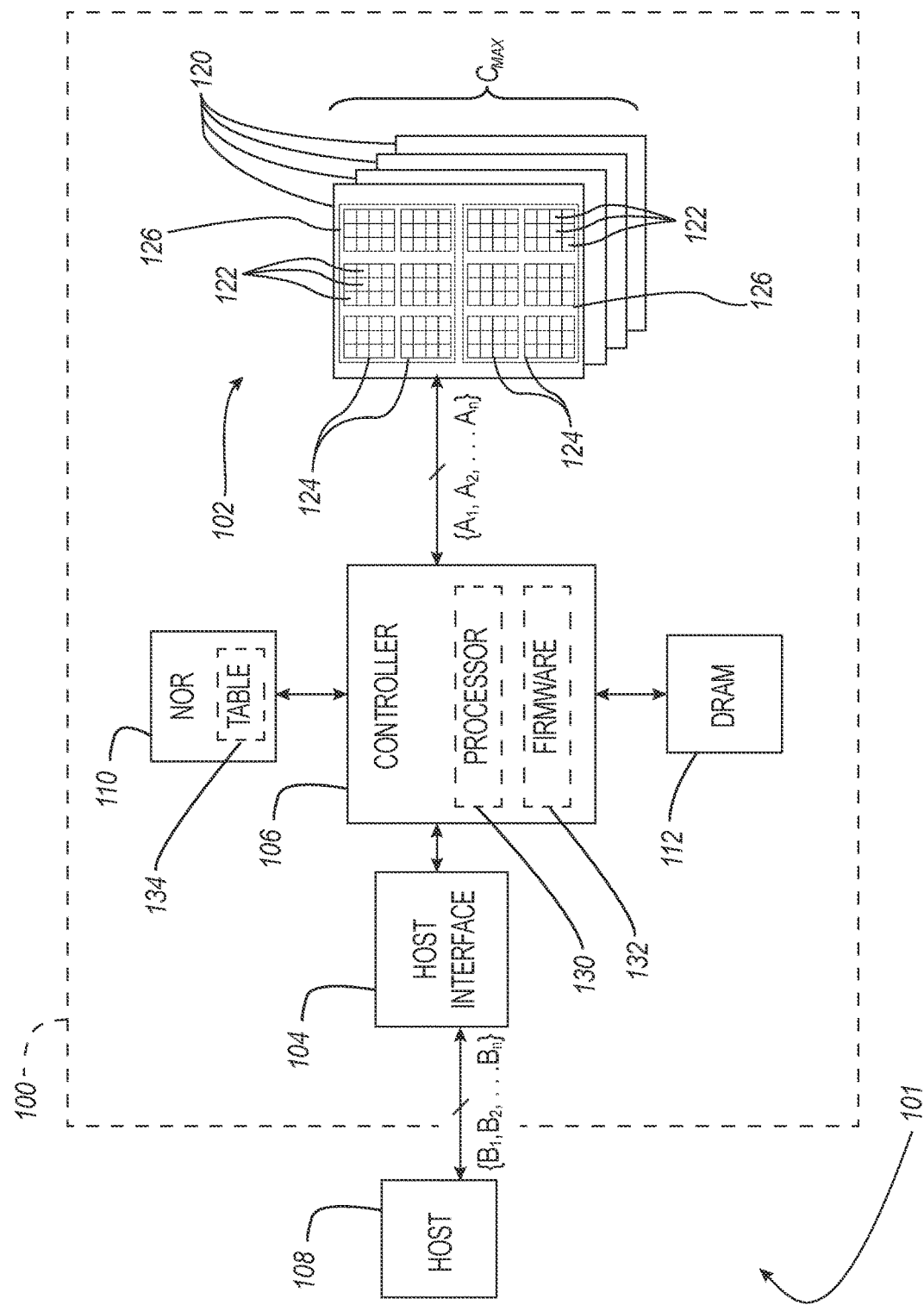
FIG. 1 is a block diagram of a system having a memory device configured in accordance with an embodiment of the present technology.

FIG. 1 is a block diagram of a system 101 having a memory device or SSD 100 configured in accordance with an embodiment of the present technology. As shown, the SSD 100 includes a main memory 102 (e.g., NAND flash), a host device interface 104, and a memory controller 106 ("controller 106") operably coupling the memory 102 to a host device 108 (e.g., an upstream central processor (CPU)) via the host device interface 104. In some embodiments, the host device 108 and the controller 106 can communicate over a serial interface, such as a serial attach SCSI (SAS), a serial AT attachment (ATA) interface, a peripheral component interconnect express (PCIe), or other suitable interface (e.g., a parallel interface). In the embodiment illustrated in FIG. 1, the SSD device 100 further includes other memory, such as NOR flash memory 110, and volatile memory, such as dynamic random access memory (DRAM) 112 (containing high-speed storage areas). The SSD 100 can also include other components (not shown) for I/O control, power management, and other functions. In other embodiments, the SSD 100 can include fewer components. For example, in one embodiment, an SSD can be configured as a universal flash storage system (UFS) comprising the memory 102, but omitting the NOR flash 110 and DRAM 112 components of the SSD 100 to reduce power requirements and/or manufacturing costs.

The memory 102 includes a plurality of memory units 120. The memory units 120 each include a plurality of memory cells 122. The memory cells 122 can include, for example, floating gate, capacitive, ferroelectric, magnetoresitive, and/or other suitable storage elements configured to store a data state persistently or semi-persistently. The memory 102 and/or the individual memory units 120 can also include other circuit components (not shown), such as multiplexers, decoders, buffers, read/write drivers, address registers, data out/data in registers, etc., for accessing and/or programming (e.g., reading and/or writing) the memory cells 122 and other functionality, such as for processing information and/or communicating with the controller 106. In one embodiment, each of the memory units 120 can be formed from a semiconductor die and arranged with other memory unit dies in a single device package (not shown). In other embodiments, one or more of the memory units can be co-located on a single die and/or distributed across multiple device packages.

In the embodiment illustrated in FIG. 1, the memory cells 122 can be arranged in groups or "memory pages" 124. The memory pages 124, in turn, can be grouped into larger groups or "memory blocks" 126. In other embodiments, the memory cells 122 can be arranged in different types of groups and/or hierarchies than shown in the illustrated embodiments. Further, while shown in the illustrated embodiments with a certain number of memory cells, pages, blocks, and units for purposes of illustration, in other embodiments, the number of cells, pages, blocks, and memory units can vary, and can be larger in scale than shown in the illustrated examples. For example, in some embodiments, the SSD 100 can include, e.g., eight, ten, or more (e.g., 16, 32, 64, or more) memory units 120. In such embodiments, each memory unit 102 can include, e.g., $2^{11}$ memory blocks 126, with each block 126 including, e.g., $2^{15}$ memory pages 124, and each memory page 124 within a block including, e.g., $2^{15}$ memory cells 122.

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory 132 (e.g., firmware) or other memory (e.g. the NOR flash 110) to perform various processes, logic flows, and routines for controlling operation of the SSD 100 and managing communications between the SSD 100 and the host device 108. In general, the controller 106 can directly access memory pages 124 individually or in groups of pages 124 and/or memory blocks 126 located in the memory 102 at memory locations corresponding to native addresses, or physical addresses [$A_1$ to $A_n$], and/or range(s) of the physical addresses (e.g., ranges of physical addresses [$A_5$ to $A_{100}$, $A_{1012}$ $A_{2004}$, and $A_{5100}$ $A_{5430}$]. For example, a number of the bits of the first physical address $A_1$ may correspond to a selected memory unit 120, a memory block 126 within the selected unit 120, and a particular memory page 124 in the selected block 126. The controller 106 can program (i.e., read and/or write) to the regions of the memory 102 at the selected physical addresses. In NAND-based memory, a write operation often includes programming the memory cells 122 in selected memory pages 124 with specific data values (e.g., a string of data bits having a value of either logic "0" or logic "1"). An erase operation is similar to a write operation, except that the erase operation reprograms an entire memory block 126 or multiple memory blocks 126 to the same data state (e.g., logic "0").

The host device 108 accesses the memory 102 via the controller 106 using host-implemented addresses, or logical addresses, [$D_1$ to $D_m$]. The logical addresses allow the host device 108 to access and program the memory pages 124, memory blocks 126, and/or memory units 120 in a manner similar to the way the controller 106 accesses the memory 102 based on the physical addresses [$A_1$ to $A_n$]. However, the logical addresses [$D_1$ to $D_m$] are typically based on addressing schemes (e.g., logical block addressing (LBA) conventions) unique to a particular manufacturer of the host device and/or the host device type. In some embodiments, the controller 106 translates between the physical and the logical addresses using a mapping table 134 stored, e.g., in DRAM memory 112, and via block, sector, hybrid, and/or other suitable mapping and/or address translation (via, e.g., a flash translation layer).

The logical capacity represents the storage size (i.e., the maximum storage) of the memory 102 as advertised to the host device 108. The logical capacity can be based on the number of logical addresses [$D_1$ to $D_m$] available to the host device 108 for reading, writing, etc. The maximum logical capacity on the host side of the controller 106 memory 102 is referred to herein as "$L_{max}$".

The physical memory capacity represents the actual storage size (i.e., the maximum physical amount of storage) of the memory 102. That is, physical capacity represents the amount of memory cells, memory blocks, etc., within the device chip(s) as manufactured and available on the memory side controller 106 via the physical addresses [$A_1$ to $A_n$]. The maximum physical capacity of the memory 102 is referred to herein as "$P_{max}$".

In the embodiment illustrated in FIGS. 2A-D, as well as in conventional SSDs, the maximum physical capacity is greater than the maximum logical capacity. This is because the SSD controller uses additional or spare memory to manage the operation of the SSD. This additional memory can be referred to as over-provisioning (OP) space. Typically, the OP space does not form part of the advertised logical capacity of an SSD. For example, an SSD advertised as having a 1.0 TB capacity, may have a physical storage capacity of 1.1 TB, with 0.1 TB dedicated to OP space and 1.0 TB dedicated to logical space. The size of the OP space can be proportional to the size of the logical capacity or the physical capacity.

A conventional SSD controller will manage the memory by dynamically assigning (and re-assigning) memory blocks to either OP space or user space (i.e., the memory accessible through logical addresses). In some conventional SSDs, the host device has a limited capability to manage the memory using a so-called "TRIM" command. The TRIM command instructs the controller to dissociate a certain number of the logical addresses from their corresponding physical addresses. The controller can trim the memory by mapping a smaller set of the logical addresses to the physical addresses to the exclusion of the trimmed out logical addresses. This disassociation is not permanent because the host device is allowed to re-associate the trimmed out logical addresses. Additionally, the SSD controller continues to manage the OP space, which ordinarily remains unchanged during a trim. In some instances, the host device can temporarily trim out logical addresses for a performance boost.

One particular use of OP space in conventional SSDs is for so called "wear leveling." Wear leveling allows the SSD to spread write degradation caused, e.g., by floating gate degradation, evenly across the entire memory to maximize operational lifetime. For example, the SSD controller preferentially writes to memory blocks that have been written less frequently than other blocks. The controller will typically associate a write count with a memory block and update its write count each time it is re-written. When a block exceeds a maximum write count, the controller will flag the block as a "bad block." The controller will no longer write to the bad block, but will use the spare block instead.

One disadvantage of conventional SSDs is that when the OP space approaches zero, the SSD controller will lock the SSD into a read-only state. This prevents further write degradation to the SSD (read operations do not cause significant degradation) and preserves the content of the memory so that it can be read into the memory of a replacement device. In the case of SSDs, the cost of replacement can be significant in terms of capital and system downtime, especially for mission-critical devices and systems, such as enterprise servers and systems that rely on large-capacity memory devices. For example, in some cases, the current cost of a 2.0 TB replacement SSD can be several thousand dollars (US).

Memory devices, such as SSDs, configured in accordance with the various embodiments of the present technology can address these and other challenges associated with conventional SSDs and other memory devices. For example, in one embodiment described below the controller can reduce the logical storage capacity $L_{max}$ after a certain amount of memory degradation (due, e.g., to write degradation) over a standard lifetime (e.g., 5 years) and/or near the standard end of life. Reducing the logical capacity $L_{max}$ is a tradeoff for an increased operational lifetime that extends beyond a standard end of life. In at least some cases, extending the operational lifetime provides customers cost savings that may outweigh the disadvantage of the reduced logical capacity $L_{max}$. Without being bound by theory, it is believed that in some cases a 1% decrease in logical capacity $L_{max}$ toward a standard end of SSD life (e.g., 5 years) can extend lifetime by, e.g., 5% (or about 3 months). In these and other cases, a 2% decrease in logical capacity $L_{max}$ extends lifetime by, e.g., 10% (e.g., or about 6 months), while further decreases in logical capacity $L_{max}$ can lead to similar incremental improvements in lifetime.

FIGS. 2A-2D are isometric, schematic diagrams of an SSD 240 in various stages of operation in accordance with an embodiment of the present technology. In the illustrated embodiments of FIGS. 2A-D only a single memory unit 120 of the SSD 240 is shown for purposes of clarity. In this embodiment and others, however, the SSD 240 can include additional memory units.

Figure 2A:
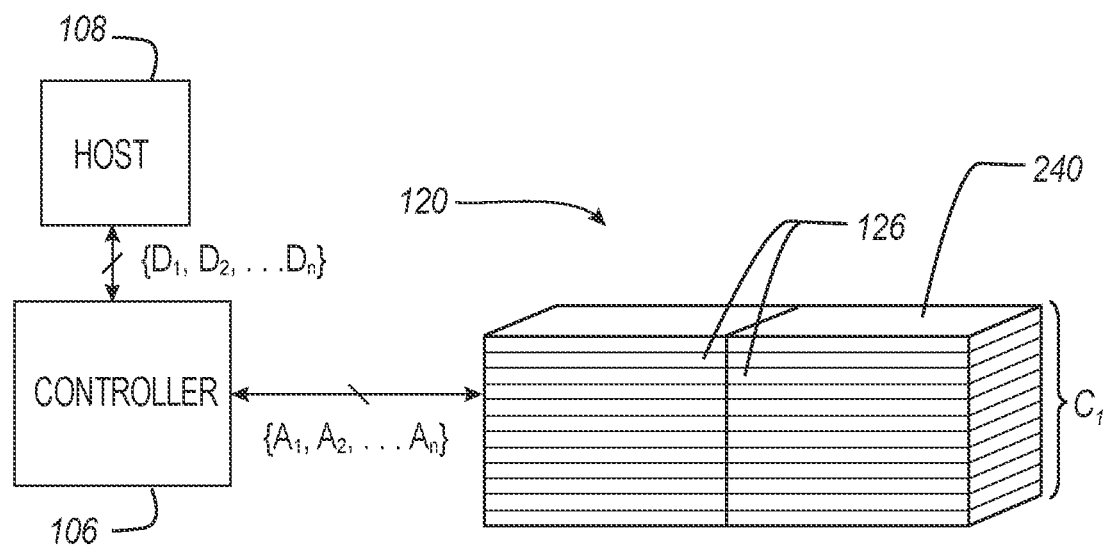
FIGS. 2A-2D are isometric, schematic diagrams of an individual memory unit of a memory device in various stages of operation in accordance with an embodiment of the present technology.

FIG. 2A shows the SSD 240 in a first stage of operation in which none of the memory blocks 126 have reached end of life. The controller 106 maps the logical addresses [$D_1$ to $D_m$] to corresponding physical addresses within the set of physical addresses [$A_1$ to $A_n$]. In the stage of FIG. 2A, the logical addresses [$D_1$ to $D_m$] correspond to a first logical memory capacity, $L_{max1}$. In this stage and/or in subsequent stages, the controller 106 can provision a number of the memory blocks 126 to OP space (not shown) for, e.g., purposes of wear-leveling, as discussed above.

Figure 2B:
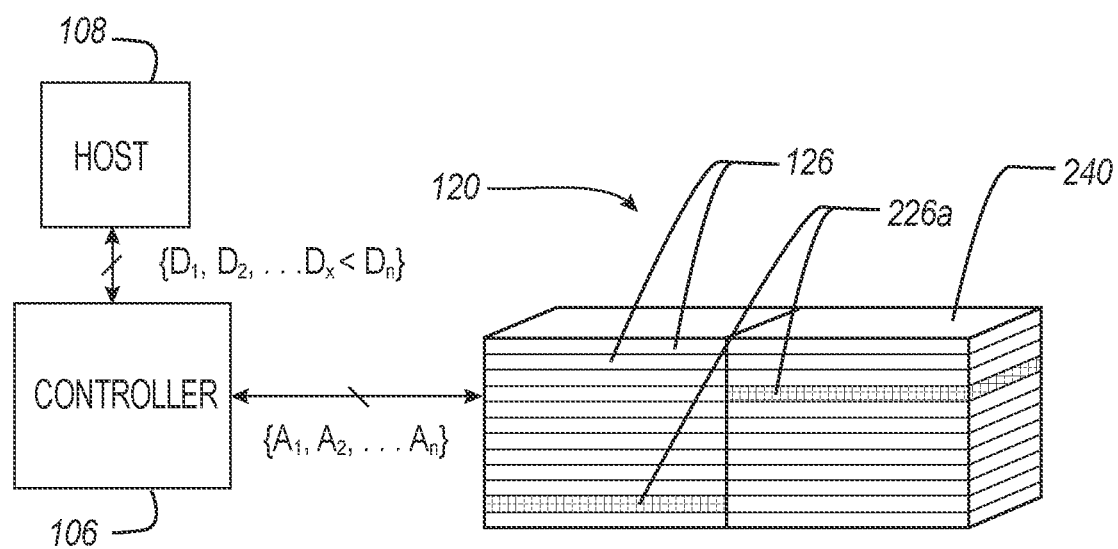

FIG. 2B shows the SSD 240 in a second stage of operation after the first stage of FIG. 2A. In this stage, the controller 106 has identified two blocks 226a ("bad blocks 226a") that are approaching end of life. In one embodiment, the controller 106 can detect end of life based on the write cycle count of the bad blocks 226a. In additional or alternate embodiments, the controller 106 can detect end of life by measuring a bit error rate produced by the bad blocks 226a using, e.g., error code correction techniques, such as Bose, Chaudhuri, and Hocquenghem (BCH) codes, low-density parity-check (LDPC) codes, or other suitable correcting codes. In some embodiments, when a memory page 124 (FIG. 1) or a certain number of memory pages 124 within the individual memory blocks 126 fail error code correction, the controller 106 can flag a memory block as being at end of life. Typically, NAND memory pages include a relatively small number of memory cells dedicated exclusively to error code correction rather than general data storage. In some cases, error code correction can provide certain advantages over standard write count techniques in that they can more readily account for non-uniform degradation caused by, e.g., variations in floating gate thickness, localized read disturbs, tier variance in 3D memories, and/or non-uniform wear levelling when operating in TRIM mode.

Figure 2C:
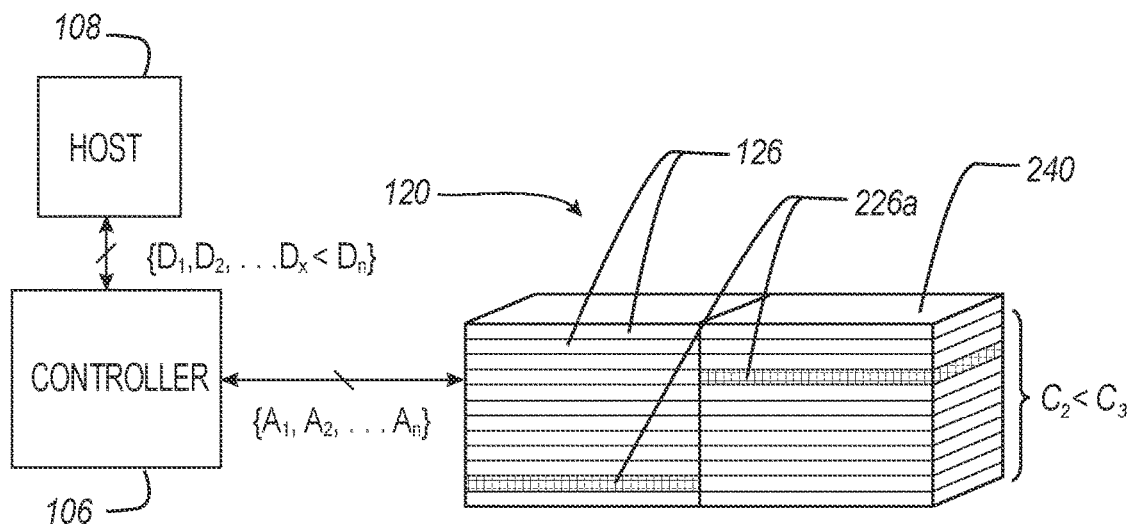

FIG. 2C shows the SSD 240 in a third stage of operation after the second stage shown in FIG. 2B. In this stage, the controller 106 has transferred the contents of the bad blocks 226a to free memory blocks (not shown) located in the memory unit 120 or another memory unit (not shown). Additionally, the controller 106 has remapped (or eliminated the mapping of) at least some of the physical addresses [$A_1$ to $A_n$] to a reduced set of logical addresses [$D_1$ to $D_x < D_m$] relative to the set of logical addresses [$D_1$ to $D_m$] of FIG. 2A. In particular, the controller 106 has permanently reduced the set of logical addresses available to the host device 108, which effectively reduces the logical capacity to a second logical capacity, $L_{max2}$, less than the first logical capacity $L_{max1}$ of FIG. 2B. In one embodiment, the controller can eliminate these logical addresses from the mapping table 134 (FIG. 1). As such, the host device 108 cannot access the bad blocks 226a via the controller 106 because the controller 106 no longer provides an address mapping for these blocks. In some embodiments, the controller can renumber the remaining logical addresses. The bad blocks 226a are thus effectively decommissioned, or "retired." In certain embodiments, the controller 106 can scale the OP space (not shown) of the SSD 240 in proportion to the change in logical capacity. In an alternate embodiment, the controller 106 can scale the user space and the capacity of the OP space in different proportions relative to one another, or the controller 106 can scale the user space, but not the OP space.

In one aspect of at least some embodiments of the present technology, neither the host device 108 nor the controller 106 has the ability to reinstate logical addresses that have been eliminated. In a related aspect, the controller 106 can advertise the second logical capacity $L_{max2}$ to the host device 108 (i.e., rather the first logical capacity $L_{max1}$). For example, in some embodiments, the controller 106 can report the second logical capacity $L_{max2}$ in a response to, e.g., a SCSI "read capacity" command and/or an NVMe "identify" command. The host device 108 will thus recognize the SSD 240 as a different device at least in the sense that the SSD 240 presents itself as a device with a logical capacity that is less than its former logical capacity.

Figure 2D:
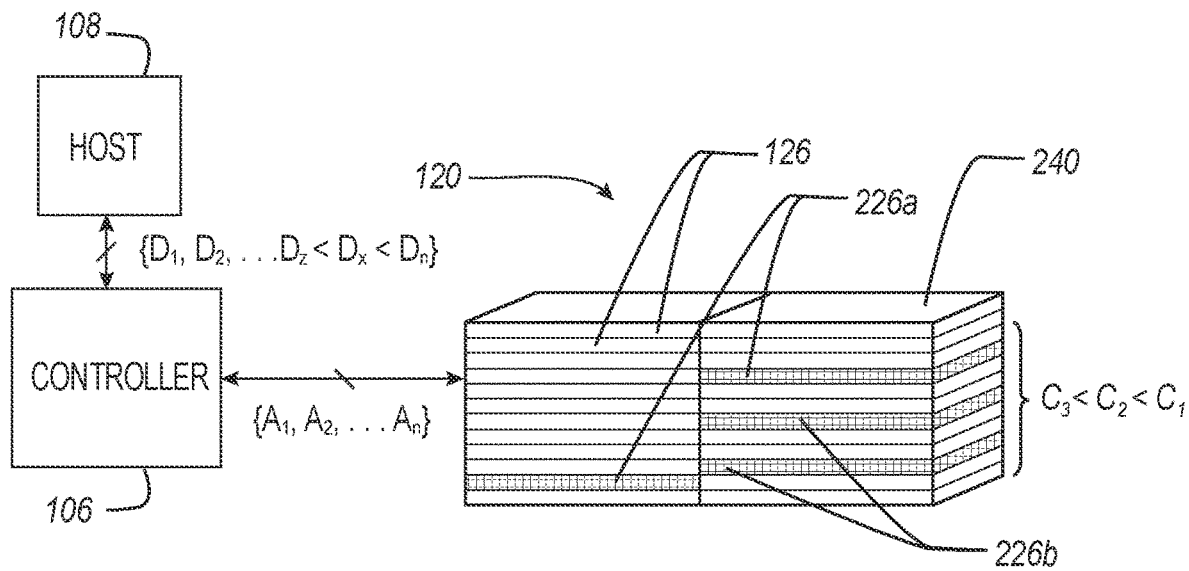

FIG. 2D shows the SSD 240 in a fourth stage of operation after the third stage shown in FIG. 2C. In the fourth stage, additional bad blocks 226b have been identified, and their contents have been transferred to free memory blocks (not shown) located in the memory unit 120 or another memory unit (not shown). Additionally, the controller 106 has remapped the physical addresses [$A_1$ to $A_n$] (FIG. 1) of the memory unit 120 of FIG. 2D to a further reduced set of logical addresses [$D_1$ to $D_z < D_x < D_m$] relative to the set of [$D_1$ to $D_x < D_m$] of FIG. 2C. As a result, the SSD 240 has a third logical capacity, $L_{max3}$, that is less than the second logical capacity $L_{max2}$ of FIG. 2C. The bad blocks 226b are also retired.

Figure 3:
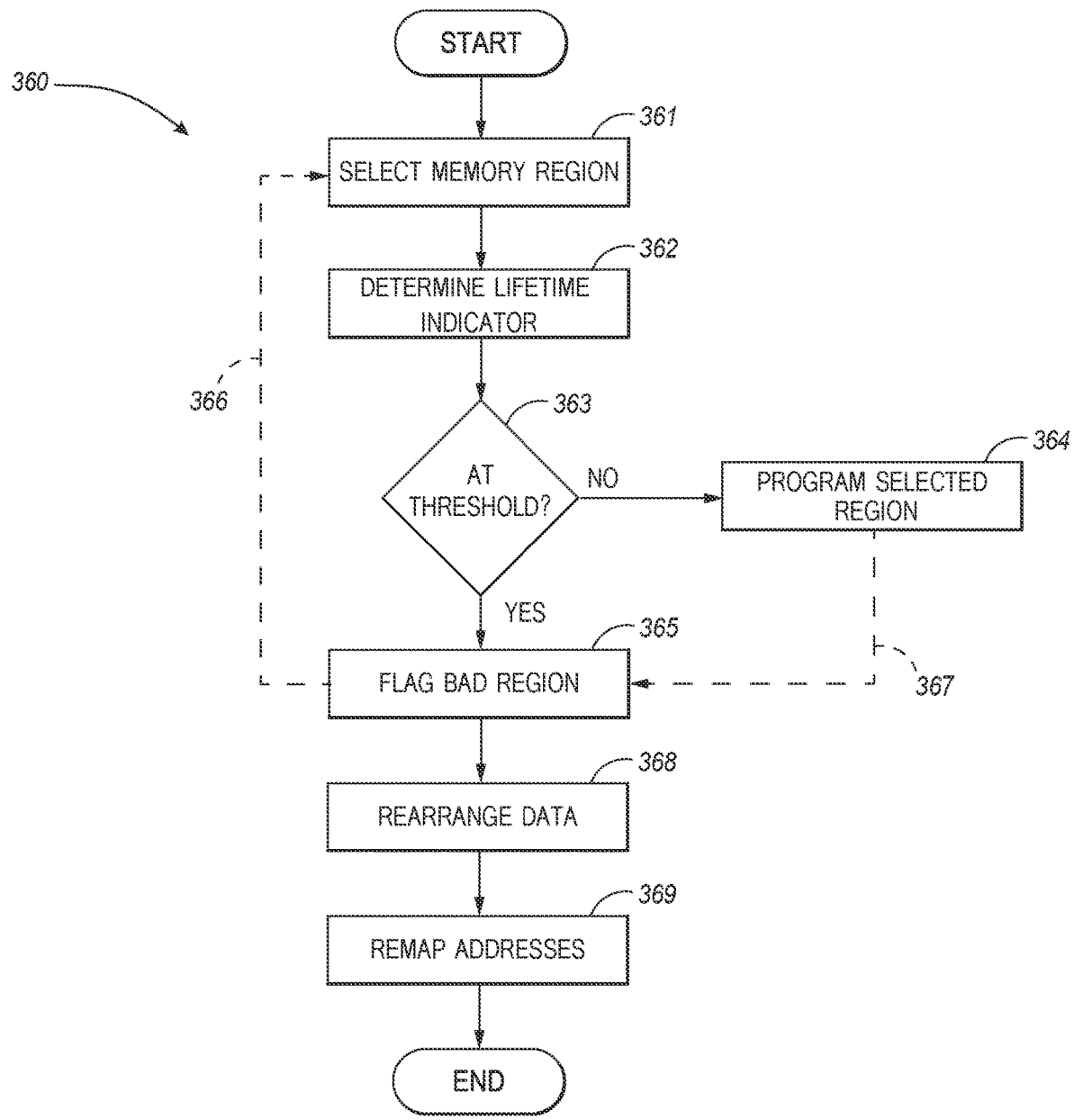
FIG. 3 is a flow diagram illustrating a method for operating a memory device in accordance with an embodiment of the present technology.

FIG. 3 is a flow diagram illustrating a routine 360 for operating a memory device, such as an SSD, in accordance with an embodiment of the present technology. The routine 360 can be executed, for example, by the controller 106, the host device 108, or a combination of the controller 106 and the host device 108 of the SSD 100 (FIG. 1). In one embodiment, the routine 360 can be carried out before writing to memory blocks 126 (FIG. 1) to ensure that the routine 360 is not writing to blocks at the end of their lifecycle. In other embodiments, the routine 360 can be carried out independent of a write operation and/or other operations (e.g., read operations).

The routine 360 begins by selecting a region of the memory 102 (block 361) such as one or more memory pages 124, memory blocks 126, and/or memory units 120 of SSD 100 (FIG. 1) for programming (e.g., reading and/or writing). The routine 360 next proceeds to determine a lifetime indicator (block 362) associated with an operational lifetime of the region of the memory 102 selected at block 361. The routine 360 can determine the lifetime indicator using, for example, write cycle counts and/or error code correction techniques, as described above.

At block 363, the routine 360 compares the lifetime indicator to a threshold value (block 363) that is based on an operational lifetime value (e.g., end-of-life value), such as an end-of-life write count (e.g., 5,000 write cycles) or an end-of-life bit error rate. The threshold value, for example, can be the end-of-life value, slightly less than the end-of-life value (e.g., −10 write counts and/or −0.1% margin of the end-of-life bit error rate), and/or slightly greater than the end-of-life value (e.g., +10 write counts and/or +0.1% margin of the end-of-life bit error rate). If the lifetime indicator is not at the threshold, the routine 360 proceeds to block 364 to program (e.g., write) the region of memory selected at block 361. The routine 360 can then terminate or continue to program additional regions of the memory. If, however, the lifetime indicator is at the threshold (e.g., equal to, slightly less than, or slightly greater than), the routine 360 flags the selected region of the memory 102 for retirement (block 365). In one embodiment described below, the routine 360 can proceed to block 368 to retire the selected region once it has been flagged for retirement. In another embodiment, the routine 360 can flag the selected region for retirement and return to block 361 (as shown by phantom arrow 366) to select a different region of the memory 102 for programming. In such embodiments, the routine 360 can proceed to block 368 to retire the flagged selected region(s) after programming has been successfully completed at block 364 (as shown by phantom arrow 367).

At block 368, the routine 360 rearranges the data of the memory by transferring the contents of the flagged region of the memory 102 to a free region of the memory, such as one or more free memory blocks 126 in the memory unit 120 that currently contains the flagged region. In some embodiments, the controller 106 can send a notification to the host device 108 indicating, for example, that one or more memory blocks 126 is nearing an end of life, the memory device will soon fill its logical capacity, and/or the logical capacity $L_{max}$ is soon to be reduced. In at least some embodiments, the controller 106 can request permission from the host device 108 to reduce the logical capacity $L_{max}$.

In response to the alert from the controller 106, the host device 108 can rearrange the contents of the memory by reading out the data stored in the effected region of the memory 102 and writing its data contents to another region of the memory device or another memory device. For example, with reference to FIG. 2C, in one embodiment the host device 108 can access the bad blocks 226a using the corresponding logical addresses [$D_1$ to $D_m$] and then move the data contents to free memory blocks 126 using standard read and write operations based on logical programming conventions. In these and other embodiments, the host device 108 can send a command to the controller 106 confirming the data contents have been moved, followed by an authorization instructing the controller 106 to remap the logical and physical addresses, as described above. For example, in one such embodiment, the confirmation from the host device 108 can indicate that a certain number of higher order logical addresses are ready to be cleared out of the mapping table 134 (FIG. 1).

In other embodiments, however, the controller 106 can manage transferring the content of the effected region of the memory 102 without intervention from the host device 108. For example, in some embodiments, the controller 106 can move data content from the effected regions of the memory 102 to other regions of the memory without notifying the host device 108. In at least some cases, the controller 106 may delay in responding to normal read/write requests from the host device 108 until the remapping is completed. In addition or alternately, the controller 106 may not require any confirmation or authorization from the host device 108 to remap the logical and physical addresses.

Referring again to FIG. 3, at block 369, the routine 360 remaps the physical addresses of the memory device to a reduced set of logical addresses. As discussed above, the routine 360 can remap the addresses to a reduced set of logical addresses and make certain logical addresses no longer available. In this embodiment and others, the remapping differs significantly from a TRIM command in that the host device 108 is precluded from rescaling the memory to its original capacity or otherwise accessing the effected regions of the memory 102.

Figure 4:
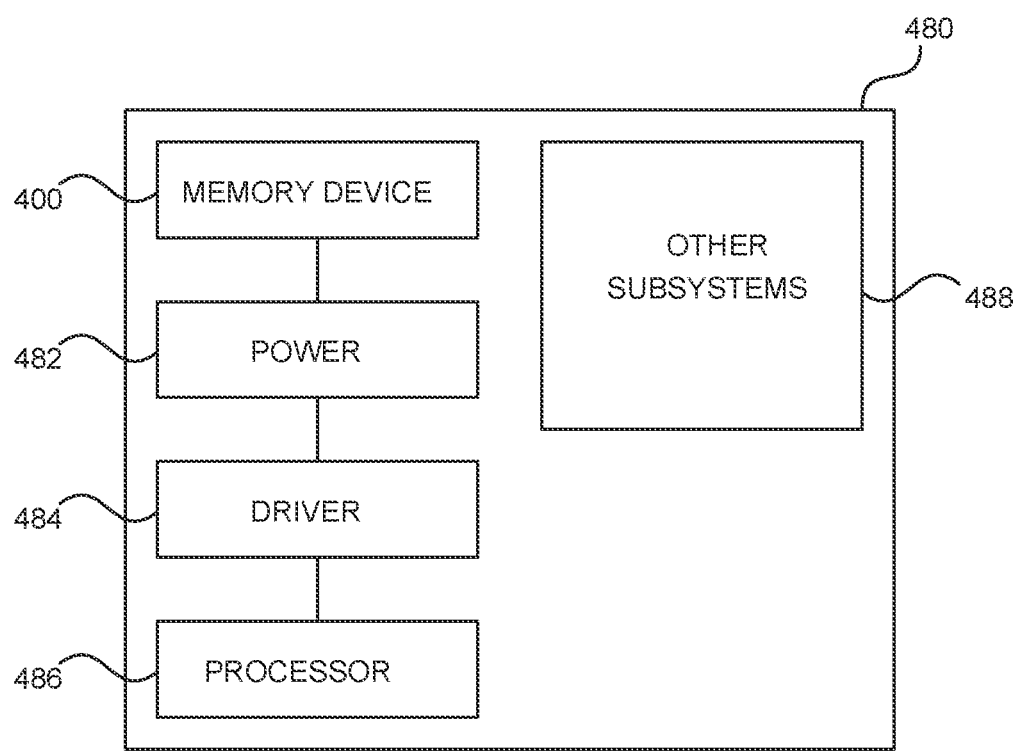
FIG. 4 is a schematic view of a system that includes a memory device in accordance with embodiments of the present technology.

FIG. 4 is a schematic view of a system that includes a memory device in accordance with embodiments of the present technology. Any one of the foregoing memory devices described above with reference to FIGS. 1-3 can be incorporated into any of a myriad of larger and/or more complex systems, a representative example of which is system 480 shown schematically in FIG. 4. The system 480 can include a semiconductor device assembly 400, a power source 482, a driver 484, a processor 486, and/or other subsystems or components 488. The semiconductor device assembly 400 can include features generally similar to those of the memory device described above with reference to FIGS. 1-3, and can, therefore, include various features that reduce memory capacity by retiring memory. The resulting system 480 can perform any of a wide variety of functions, such as memory storage, data processing, and/or other suitable functions. Accordingly, representative systems 480 can include, without limitation, hand-held devices (e.g., mobile phones, tablets, digital readers, and digital audio players), computers, vehicles, appliances and other products. Components of the system 480 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. For example, in one embodiment, a memory device controller can map memory pages to the exclusion of other pages within a single block or multiple blocks, without flagging an entire block or group of blocks as a bad block. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A method of operating a memory device, wherein the memory device includes a main memory and a controller operably coupling the main memory to a host device, wherein the main memory includes a plurality of memory regions that collectively define a physical memory capacity, and wherein the method comprises:
   advertising a first logical memory capacity to the host device, wherein the first logical memory capacity is less than the physical memory capacity;
   determining that at least one of the memory regions is at or near end of life; and
   in response to determining that the at least one of the memory regions is at or near end of life—
      sending a notification to the host device that a logical memory capacity of the memory device will be reduced,
      after sending the notification, retiring the at least one of the memory regions, and
      reducing the logical memory capacity of the memory device to a second logical memory capacity that is less than the first logical memory capacity, whereby the memory device with the reduced logical capacity is recognized as a different device by the host device.

2. The method of claim 1, wherein:
   the memory regions have corresponding first memory addresses;
   the method further comprises mapping the first memory addresses to second memory addresses implemented by the host device for accessing the memory regions via the controller; and
   retiring the at least one of the memory regions includes remapping the first and second memory addresses such that the at least one of the memory regions is permanently inaccessible to the host device via the controller.

3. The method of claim 1, wherein the memory regions are memory blocks formed in one or more semiconductor dies.

4. The method of claim 1, wherein the memory regions are memory pages formed in memory blocks that are formed in one or more semiconductor dies.

5. The method of claim 1, wherein retiring the at least one of the memory regions further includes reducing an over-provisioning (OP) storage capacity of the memory device.

6. The method of claim 1, wherein reducing the logical memory capacity includes permanently reducing a set of logical addresses used by the host device to a reduced set of logical addresses.

7. The method of claim 1, wherein retiring the at least one of the memory regions includes transferring contents of the at least one of the memory regions to one or more other memory regions of the plurality of memory regions.

8. The method of claim 1, further comprising:
   prompting the host device to transfer contents of the at least one of the memory regions to one or more other memory regions of the plurality of memory regions.

9. The method of claim 1, wherein the determination for the at least one of the memory regions is based on a write count associated with the at least one of the memory regions.

10. The method of claim 1, wherein the determination for the at least one of the memory regions is based on a bit error rate associated with the at least one of the memory regions.

11. The method of claim 1, further comprising:
    operating the controller to maintain a mapping table used to translate between physical addresses and logical addresses, wherein—
       the physical addresses identify locations within the plurality of memory regions and correspond to the physical memory capacity,
       the logical addresses identify memory locations for the host device, and
       the mapping table is maintained by eliminating from the mapping table (1) a portion of the physical addresses and (2) corresponding logical addresses in response to the determination, wherein resulting logical addresses correspond to the second logical memory capacity.

12. The method of claim 11, wherein operating the controller to maintain the mapping table includes eliminating the portion of the physical addresses and the corresponding logical addresses from the mapping table without an intervention from the host device, without notifying the host device, without a confirmation from the host device, without an authorization from the host device, or a combination thereof.

13. A system, comprising:
    a host device; and
    a memory device storing a mapping table, wherein the memory device has a plurality of memory regions and a controller operably coupling the memory regions to the host device based on the mapping table, wherein the controller is configured to—
       send a notification to the host device that a logical memory capacity of the memory device will be reduced,
       after sending the notification, retire the at least one of the memory regions, and
       reduce the logical memory capacity of the memory device to a second logical memory capacity that is less than the first logical memory capacity;
    wherein
    the host device recognizes the memory device as a different device based on the reduced logical capacity.

14. The system of claim 13, wherein:
    the controller is further configured to notify the host device that the at least one of the memory regions is at or near end of life; and
    the host device is configured to transfer contents of the at least one of the memory regions to one or more other memory regions of the plurality of memory regions in response to the notification from the controller.

15. The system of claim 13, wherein the controller is further configured to:
    transfer contents of the at least one of the memory regions to one or more other memory regions of the plurality of memory regions in response to determining that the at least one of the memory regions is at or near end of life; and
    update the mapping table according to the transfer.

16. The system of claim 13, wherein the controller is further configured to notify the host device that the memory device has a permanently reduced memory capacity after updating the mapping table.

17. The system of claim 16 wherein the memory device comprises a solid state drive.

18. The system of claim 13, wherein the controller is configured to reduce the logical memory capacity by eliminating from the mapping table the portion of the physical addresses and the corresponding logical addresses without an intervention from the host device, without notifying the host device, without a confirmation from the host device, without an authorization from the host device, or a combination thereof.

19. A solid state drive (SSD), comprising:
a plurality of memory regions collectively defining a physical memory capacity; and
a controller operably coupled to the memory regions, wherein the controller is configured to—
  advertise a first logical memory capacity to a host device,
  determine that at least one of the memory regions is at or near end of life,
  in direct response to the determination—
    send a notification to the host device that a logical memory capacity of the memory device will be reduced,
    after sending the notification, retire the at least one of the memory regions, and
    reduce the logical memory capacity of the memory device to a second logical memory capacity that is less than the first logical memory capacity, whereby the memory device with the reduced logical capacity is recognized as a different device by the host device.

20. The SSD of claim 19, wherein the controller is configured to reduce the logical memory capacity by permanently removing the at least one of the memory regions from access by the host without an intervention from the host device, without notifying the host device, without a confirmation from the host device, without an authorization from the host device, or a combination thereof.

* * * * *